(12) United States Patent
Ko et al.

(10) Patent No.: US 6,974,755 B2
(45) Date of Patent: Dec. 13, 2005

(54) ISOLATION STRUCTURE WITH NITROGEN-CONTAINING LINER AND METHODS OF MANUFACTURE

(75) Inventors: Chih-Hsin Ko, Kaohsiung (TW); Yee-Chia Yeo, Hsin-Chu (TW); Chung-Hu Ge, Taipei (TW); Wen-Chin Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/687,377

(22) Filed: Oct. 16, 2003

(65) Prior Publication Data

US 2005/0035426 A1 Feb. 17, 2005

Related U.S. Application Data

(60) Provisional application No. 60/495,316, filed on Aug. 15, 2003.

(51) Int. Cl.$^7$ ................................................ H01L 21/76
(52) U.S. Cl. ...................... 438/424; 438/221; 438/296; 438/359
(58) Field of Search ................................. 438/221, 296, 438/359, 424–438

(56) References Cited

U.S. PATENT DOCUMENTS

| | | | |
|---|---|---|---|
| 4,631,803 A | 12/1986 | Hunter et al. | |
| 5,447,884 A | 9/1995 | Fahey et al. | |
| 5,763,315 A | 6/1998 | Benedict et al. | |
| 5,811,347 A | 9/1998 | Gardner et al. | |
| 6,020,621 A | 2/2000 | Wu | |
| 6,046,487 A | 4/2000 | Benedict et al. | |
| 6,228,727 B1 * | 5/2001 | Lim et al. | 438/424 |
| 6,251,746 B1 | 6/2001 | Hong et al. | |
| 6,265,317 B1 | 7/2001 | Chiu et al. | |
| 6,291,321 B1 | 9/2001 | Fitzgerald | |
| 6,323,106 B1 * | 11/2001 | Huang et al. | 438/433 |
| 6,391,729 B1 | 5/2002 | Hui | |
| 6,417,070 B1 | 7/2002 | Ballantine et al. | |
| 6,426,271 B2 | 7/2002 | Chen et al. | |
| 6,429,061 B1 | 8/2002 | Rim | |
| 6,461,936 B1 | 10/2002 | von Ehrenwall | |
| 6,461,937 B1 | 10/2002 | Kim et al. | |
| 6,468,853 B1 | 10/2002 | Balasubramanian et al. | |
| 6,482,718 B2 | 11/2002 | Shiozawa et al. | |
| 6,495,424 B2 | 12/2002 | Kunikiyo | |
| 6,723,617 B1 * | 4/2004 | Choi | 438/424 |

FOREIGN PATENT DOCUMENTS

TW          461025          10/2001

OTHER PUBLICATIONS

Shimizu, A., et al., "Local Mechanical–Stress Control (LMC): A New Technique for CMOS–Performance Enhancement," International Electron Devices Meeting (2001) pp. 433–436.
Thompson, S., et al., "A 90 nm Logic Technology Featuring 50nm Strained Silicon Channel Transistors, 7 Layers of Cu Interconnects, Low k ILD, and 1 um$^2$ SRAM Cell," International Electron Devices Meeting (Dec. 2002) pp. 61–64.
Welser, J., et al., "NMOS and PMOS Transistors Fabricated in Strained Silicon/Relaxed Silicon–Germanium Structures," International Electron Devices Meeting (Dec. 1992) pp. 1000–1002.

* cited by examiner

Primary Examiner—Kevin M. Picardat
(74) Attorney, Agent, or Firm—Slater & Matsil, L.L.P.

(57) ABSTRACT

A semiconductor isolation trench includes a substrate and a trench formed therein. The trench is lined with a nitrogen-containing liner and filled with a dielectric material. The nitrogen-containing liner preferably contacts the active region of a device, such as a transistor, located adjacent to the trench.

56 Claims, 11 Drawing Sheets

ISOLATION STRUCTURE WITH NITROGEN-CONTAINING LINER AND METHODS OF MANUFACTURE

CROSS-REFERENCE TO RELATED APPLICATIONS

This application claims the benefit of U.S. Provisional Application No. 60/495,316 filed on Aug. 15, 2003, entitled Isolation Structure with Nitrogen-Containing Liner and Methods of Manufacture, which application is hereby incorporated herein by reference.

This application relates to the following patents and co-pending, commonly-assigned patent applications. Each of these documents is incorporated herein by reference.

| Patent or Serial No. | Filing Date | Issue Date |
|---|---|---|
| 10/423,513 | Apr. 25, 2003 | — |
| 6,020,621 | Jan. 28, 1998 | Feb. 1, 2000 |

TECHNICAL FIELD

The present invention relates to the field of semiconductor devices, and more specifically, to the formation of improved isolation structures with nitrogen-containing liners.

BACKGROUND

Figure 1:
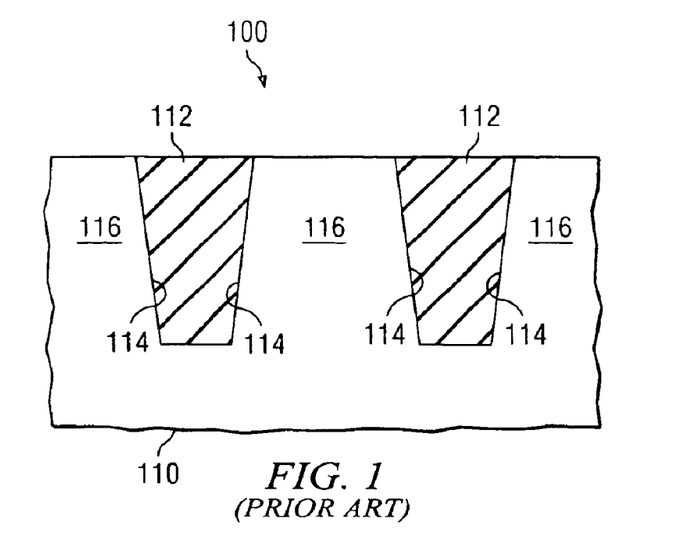
FIG. 1 is a cross-section view of a wafer illustrating isolation trenches.

Shallow trench isolation (STI) is a common isolation technology for insulating active areas in integrated circuits, particularly integrated circuits with sub-quarter micron dimensions. An example of one common shallow trench isolation structure is shown in FIG. 1, wherein a wafer 100 has a substrate 110 having isolation trenches 112 formed therein. The substrate 110 is typically silicon. The isolation trenches 112 are typically filled with a dielectric material, such as a silicon oxide or another oxide. The isolation trenches 112 isolate active regions 116 from each other.

During fabrication, oxidation of the sidewalls of the isolation trenches may occur during subsequent processing steps. As a result of the oxidation and the volume expansion that occurs during the oxidation, however, compressive stress may be induced in the adjacent active regions 116. The compressive stress results because of volume expansion in a confined space.

To solve this problem, several approaches have been proposed for the formation of trench isolation structures with nitride liners. Generally, these approaches use a nitride liner to prohibit or reduce further trench sidewall oxidation in order to reduce the stress introduced by the trench filling material. For example, U.S. Pat. No. 5,447,884 issued to Fahey et al. describes a shallow isolation trench with a thin nitride liner; U.S. Pat. No. 6,461,937 issued to Kim et al. describes methods of forming trench isolation structures containing a silicon nitride layer stress relief layer; U.S. Pat. No. 6,251,746 issued to Hong et al., describes methods of forming trench isolation regions with stress-reducing nitride layers; and U.S. Pat. Nos. 6,461,937 and 6,251,746 describe nitride layers overlying a silicon oxide layer that is typically thermally grown at an elevated temperature.

While the nitride liners prohibit further oxidation of the trench sidewalls and, thus, reduce the compressive stress that results, nitride liners are usually formed with an intrinsic stress in the film. In addition, due to the intrinsic stress in the nitride liner, defects or even cracks may be formed at weak regions in the active regions, such as at sharp corners.

Furthermore, approaches have been proposed to use an oxide liner beneath the nitride liner, thus reducing the influence of the nitride liner on the active region. The use of an oxide liner, however, typically involves a high thermal budget.

Therefore, there is a need for a method of forming isolation trenches to prohibit or reduce the effect of oxidation of the isolation trench sidewalls.

SUMMARY OF THE INVENTION

These and other problems are generally solved or circumvented, and technical advantages are generally achieved, by preferred embodiments of the present invention which provides an isolation structure with nitrogen-containing liner and methods of manufacture.

In one embodiment of the present invention, an isolation trench within a substrate is provided. The isolation trench is lined with a nitrogen-containing material and filled with a dielectric material. The nitrogen-containing material contacts or is in close proximity with the active area adjacent to the isolation trench.

In another embodiment of the present invention the corners of the isolation trench are rounded. In yet another embodiment of the present invention, an active device, such as a transistor, is formed near the isolation trench. The active device may be covered with an inter-layer dielectric and metal lines.

The present invention also provides several methods of fabricating the isolation trenches. For example, in one embodiment of the present invention a trench is formed in a substrate. A nitrogen-containing liner is deposited upon the substrate, and a filler material is deposited on the nitrogen-containing liner. The portions of the nitrogen-containing liner not contained in or near the trench is removed. Portions of the filler material that are not contained in the isolation trench are also removed. Thereafter, an active device, such as a transistor, may be formed adjacent to the isolation trench.

In another method, a mask layer is applied to the substrate to form the trench in the substrate. The mask is removed after the trench is formed. A nitrogen-containing liner is applied, and a filler material is deposited on the nitrogen-containing liner.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIGS. 2a–2m illustrate cross-section views of a wafer during various steps of a first method embodiment of the present invention. The process begins in FIG. 2a, wherein a wafer 200 having a substrate 210 has been prepared by applying a hard mask 212 thereto. The substrate 210 may be silicon or glass, but preferably silicon.

Figure 2A:
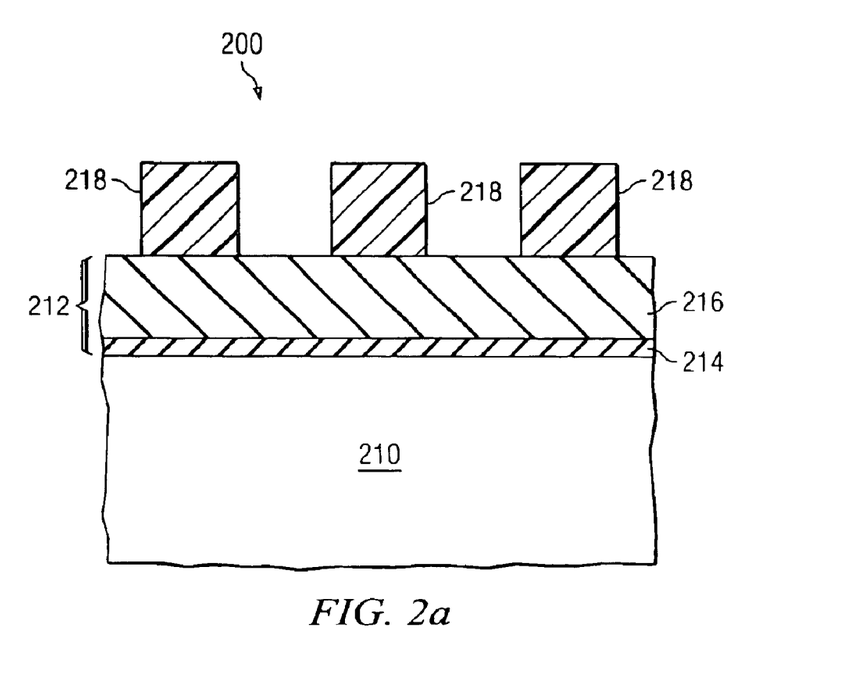
FIGS. 2a–2m are cross-section views of a wafer illustrating a process of forming isolation trenches in accordance with an embodiment of the present invention.

The hard mask 212 preferably comprises an oxide layer 214 and a nitride layer 216. Preferably the oxide layer 214 comprises a silicon dioxide layer formed by thermal oxidation or by chemical vapor deposition (CVD) techniques using is tetra-ethyl-ortho-silicate (TEOS) and oxygen as precursor. The nitride layer 216 is preferably a silicon nitride ($Si_3N_4$) layer formed on top of the oxide layer 214. The $Si_3N_4$ layer may be formed using CVD techniques using silane and ammonia as precursor gases, and deposition temperatures ranging from about 550° to about 900° Celsius (C).

A patterned mask 218, such as a photoresist mask, is then formed on the hard mask 212. The patterned mask 218 may be a photoresist material. The patterned mask 218 defines the areas of the hard mask 212 that are to be removed, preferably via an etching process. The etching process may be a wet or dry, anisotropic or isotropic, etch process, but preferably is an anisotropic dry etch process.

Figure 2B:
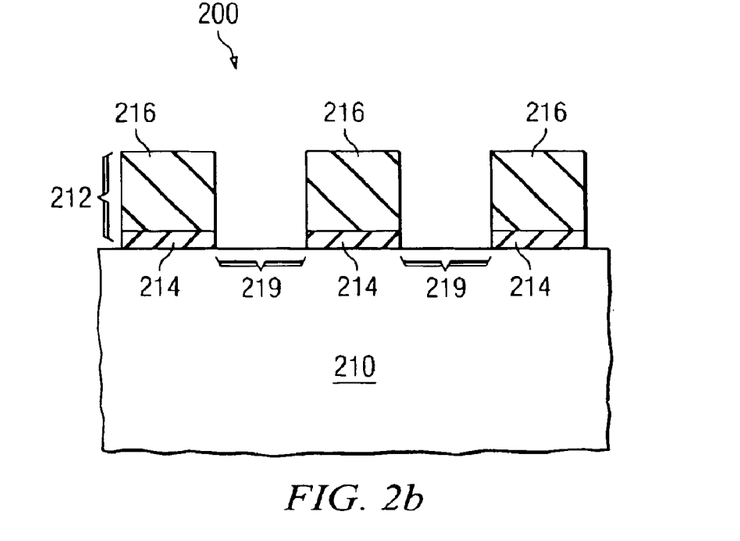

FIG. 2b is a cross view of the wafer 200 illustrated in FIG. 2a after the patterned mask 218 (FIG. 2a) has been removed and the exposed areas of the hard mask 212 have been etched away. The resulting wafer 200 exposes areas 219 of the substrate that are to be trenched in subsequent processing.

Figure 2C:
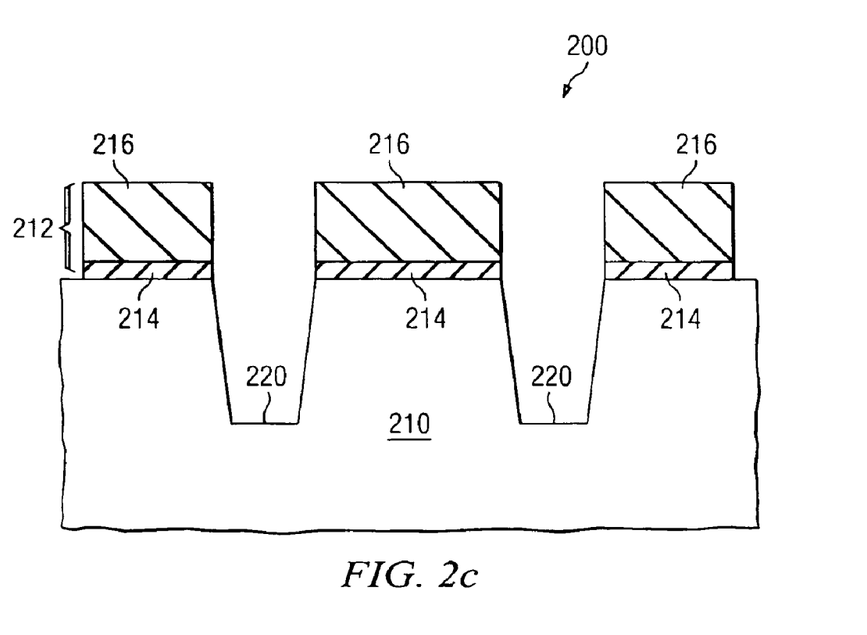

FIG. 2c is a cross view of the wafer 200 illustrated in FIG. 2b after isolation trenches 220 have been created in the substrate 210. The patterned hard mask 212 is used to etch trenches in the substrate 210. The depth of the isolation trenches 220 is preferably about 2000 to about 6000 Å, but may be more or less as desired for a particular application.

Figure 2D:
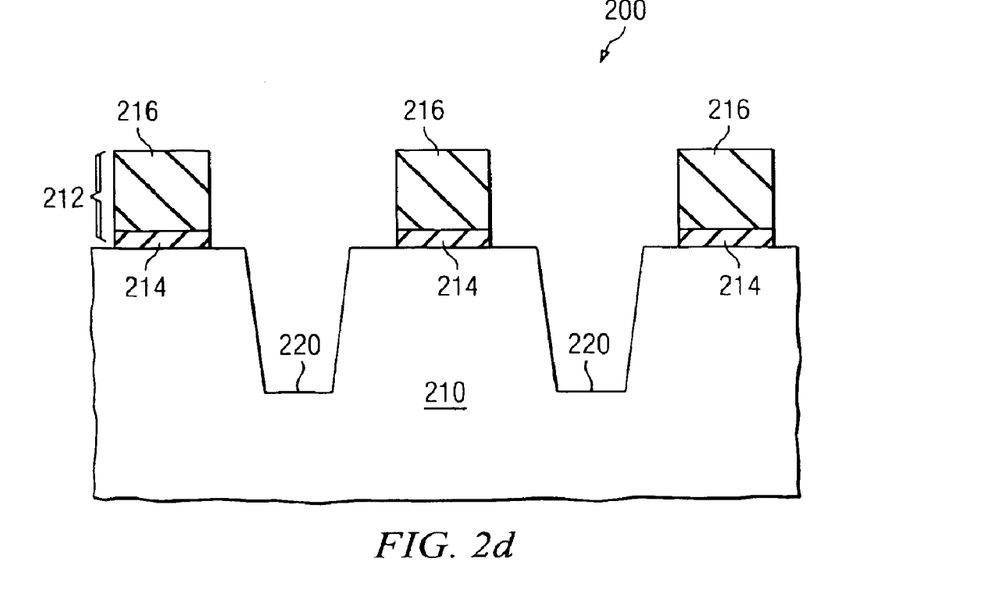

FIG. 2d is a cross view of the wafer 200 illustrated in FIG. 2c after a pull-back process has been performed. The pull-back process is used to etch a portion of the hard mask 212, i.e., the $SiO_2$ and $Si_3N_4$ layers, such that the hard mask 212 retreats from the edge of the isolation trench 220. Preferably, the amount of pull-back from the edge of the isolation trench 220 is about 10 to 50 nm, but may be more or less depending upon the integrated circuit design. The pull-back process may be performed by a wet etch process using phosphoric acid at a temperature in the range of 100° to 180° Celsius using an etch time of about 30 to 2,000 seconds to etch the $Si_2N_3$ layer, i.e., nitride layer 216, followed by another wet etch process in dilute hydrofluoric acid at a temperature in the range of about 10° to 40° Celsius using an etch time of about 2 to 200 seconds to etch the silicon dioxide, i.e., oxide layer 214.

Alternatively, the pull-back process may be a dry plasma etch process using fluorine chemistry to etch the silicon nitride, followed by a wet etch in dilute hydrofluoric acid at a temperature in the range of 10° to 40° Celsius using an etch time of between 2 seconds to 200 seconds to etch the $SiO_2$, i.e., the oxide layer 214.

Figure 2E:
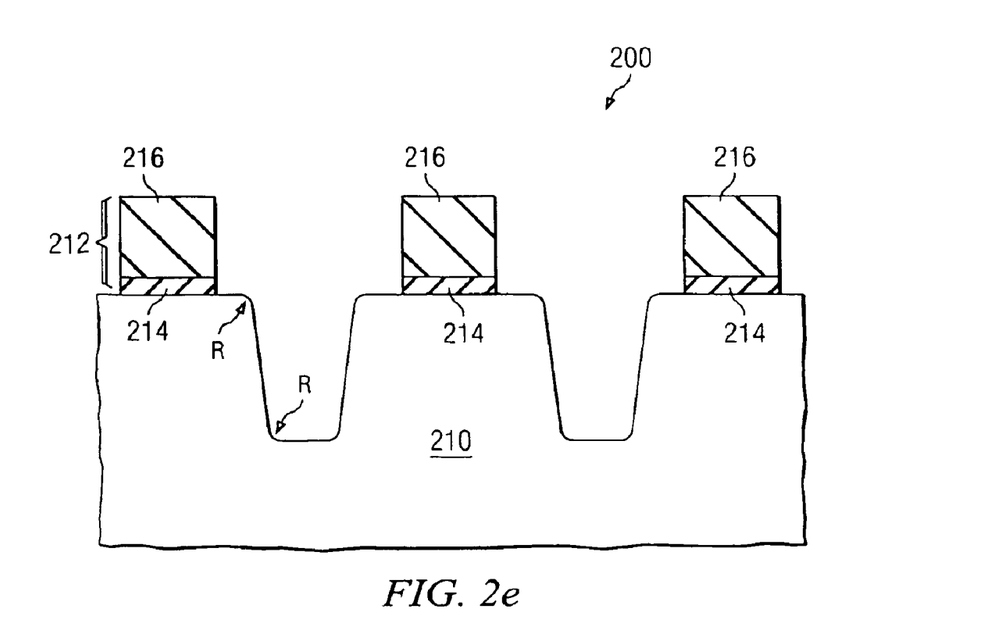

A corner rounding process is then performed as illustrated in FIG. 2e. The corner rounding process is preferably an annealing process using a temperature of between 700° to 1000° degrees Celsius to facilitate silicon atom migration. The annealing process may employ an ambient containing a gas such as hydrogen, nitrogen, helium, neon, argon, xenon, combinations thereof, or the like. The annealing ambient may have a pressure in the range of about 1 to about 1000 Torr. Most preferably, however, the annealing ambient is a hydrogen-containing ambient with a pressure of between about 10 and about 1000 Torr and a temperature of between about 700° and about 950° C. In general, a higher temperature and a lower pressure will facilitate more silicon migration to form rounded corners. After the corner rounding process is complete, the radius of the rounded corner (reference "R" of FIG. 2e) is preferably in the range of about 5 nm to about 50 nm.

Figure 2F:
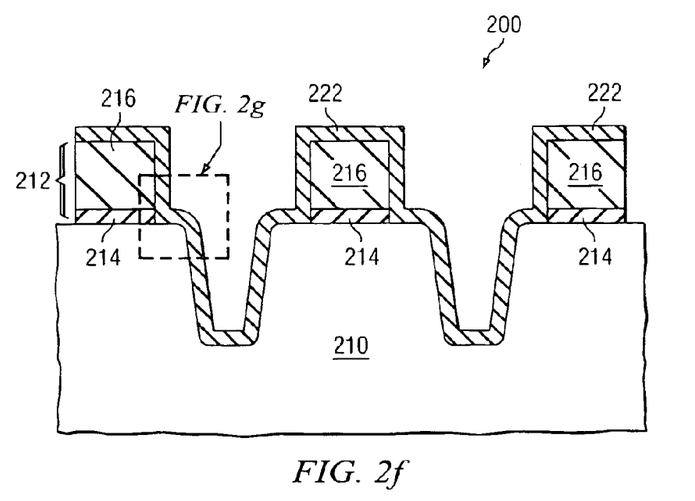
Figure 2G:
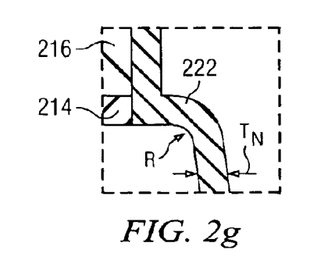

FIGS. 2f and 2g are cross-section views of the wafer 200 illustrated in FIG. 2e after a nitrogen-containing liner 222 is formed. Preferably, the nitrogen-containing liner 222 is formed by CVD techniques known and used in the art. The nitrogen-containing liner 222 can be a single silicon nitride layer or a silicon oxynitride $SiO_xN_y$ layer or a nitrogen-doped silicon oxide material, where the atomic percentage of nitrogen in the nitrogen-containing liner may be in the range of about 5 percent to about 60 percent. It is understood, however, that other materials with an oxygen diffusion rate lower than that of silicon oxide may be used.

The thickness TN (FIG. 2g) of the nitrogen-containing liner 222 is preferably in the range of about 0.5 nm and about 20 nm, although it is understood that thicknesses thinner than or thicker than the range specified may be used. The nitrogen-containing liner 222 preferably has an intrinsic stress of between about −1 giga-pascals (GPa) to about +2 GPa, where negative stress indicates compressive stress and positive stress indicates tensile stress. The nitrogen-containing liner 222 is preferably a high tensile stress conformal nitride liner.

In accordance with one embodiment of the present invention, the influence of the intrinsic stress in the nitrogen-containing liner 222 on the silicon lattice in the active region can be maximized by having a nitrogen-containing liner that directly contacts the trench sidewalls. The nitrogen-containing liner 222 additionally prevents further oxidation of the trench sidewall during subsequent process steps. Because the nitrogen-containing liner 222 exerts a significant stress on the silicon lattice in the active region, it is important that the silicon lattice contains no weak regions that potentially crack or generate dislocations or defects. Sharp corners are an example of such weak regions where stress may be concentrated and where defects may be generated. It is therefore preferred that rounded corners in the upper and bottom portions of the trench are formed prior to the formation of the nitrogen-containing liner 222.

Figure 2H:
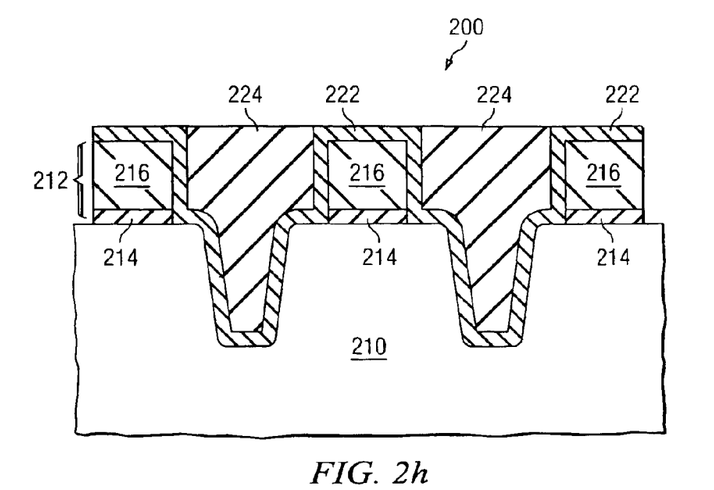

FIG. 2h is a cross-sectional view of the wafer 200 illustrated in FIG. 2f after a trench-filling material 224 has been deposited to fill the trench. The trench-filling material 224 is a dielectric material, preferably silicon oxide. It is understood that the trench-filling material may in fact be a combination of trench-filling materials, such as a combination of CVD silicon oxide and CVD poly-silicon. After deposition, the trench-filling material can be densified by either a pyrogenic oxidation anneal at a temperature of 800° Celsius or conventional annealing step in argon ambient at 1000° C.

A planarization step is performed to planarize the surface of the trench-filling material, stopping on the nitrogen-containing liner 222 or on the silicon nitride layer 216. The planarization step may be accomplished, for example, using a chemical mechanical polishing (CMP) process known and used in the art.

Figure 2I:
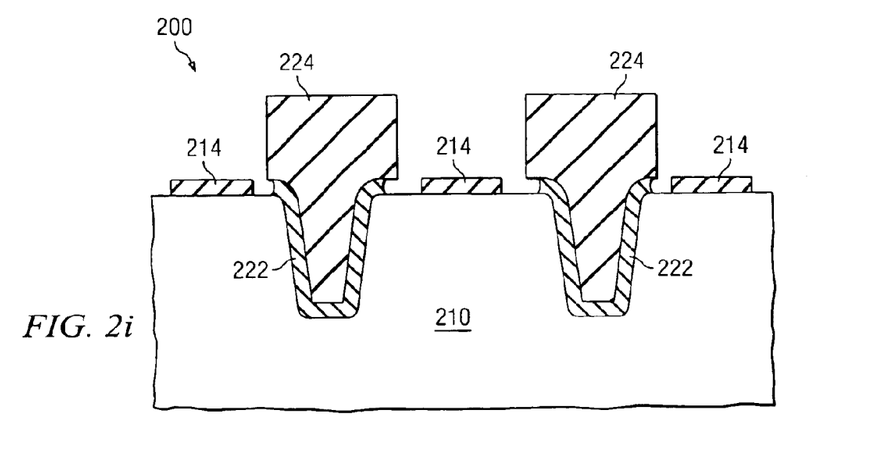

FIG. 2i is a cross-sectional view of the wafer 200 from FIG. 2h after the silicon nitride layer 216 and the nitrogen-containing liner 222 on the silicon nitride layer 216 are removed. The nitrogen-containing liner 222 on the silicon nitride layer 216 and the silicon nitride layer 216 can be removed, for example, by using an etch in hot phosphoric acid followed by an etch in dilute hydrofluoric acid.

Figure 2J:
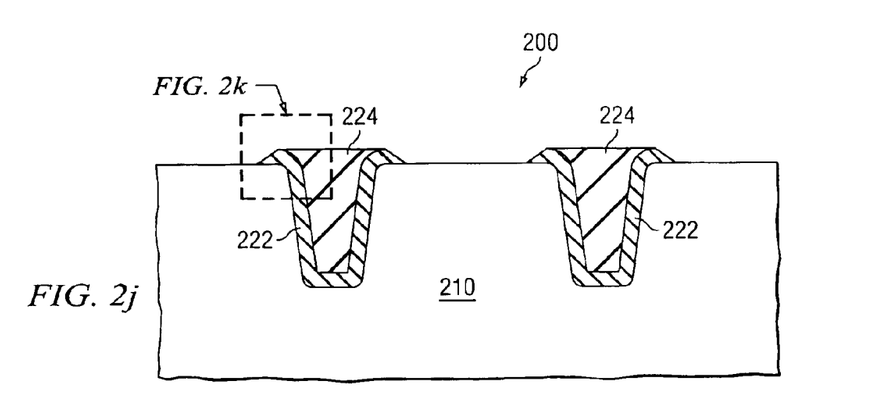
Figure 2K:
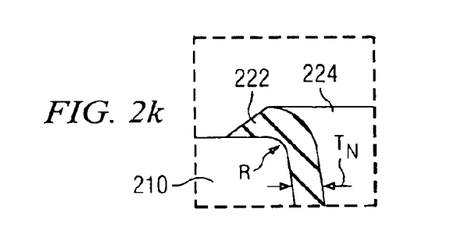

FIGS. 2j and 2k are cross-section views of the wafer 200 illustrated in FIG. 2i after the silicon dioxide layer 214 has been removed. Preferably, the silicon dioxide layer 214 is removed by dilute hydrofluoric acid. Transistors may then be formed in the active regions.

Figure 2L:
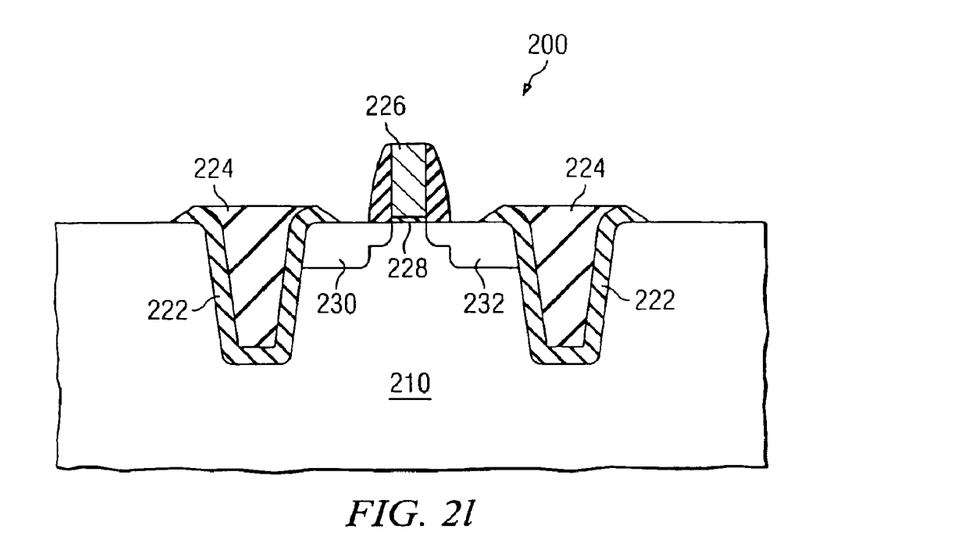
Figure 2M:
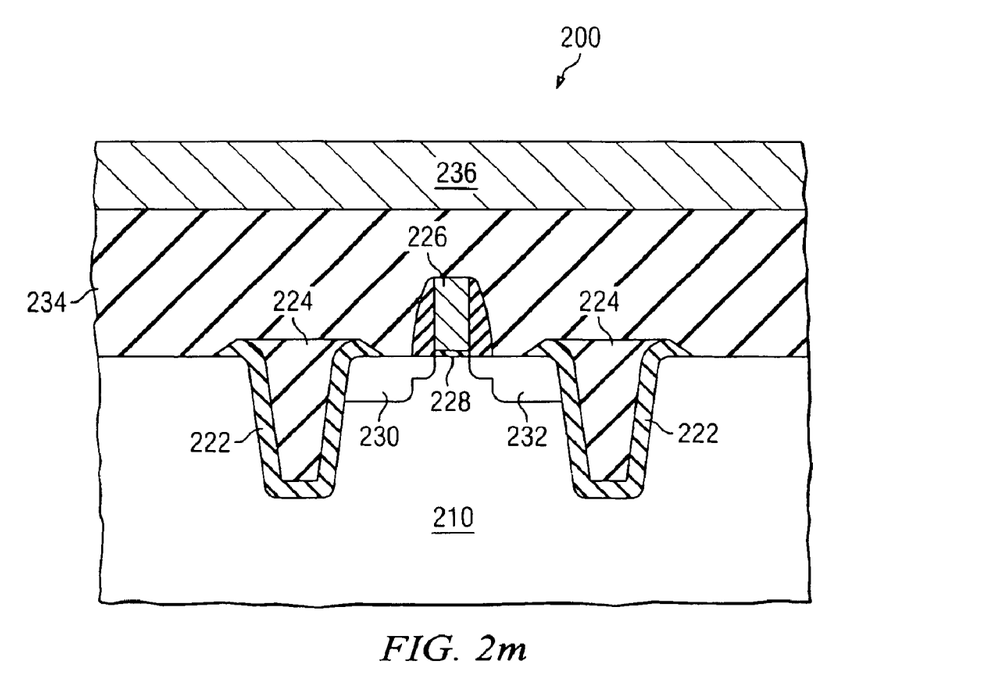

For example, FIGS. 2l–2m show a cross-section of the wafer with a transistor formed thereon. The transistor comprises of a gate electrode 226, a gate dielectric 228, a source region 230, and a drain region 232. After the formation of the transistor, an inter-layer dielectric (ILD) 234 may be deposited over the transistor. The ILD layer 234 typically has a planarized surface and may be comprised of silicon oxide. The ILD layer 234 may be formed by deposition techniques such as CVD. Metal lines 236 may be formed on the planarized surface of the ILD layer 234. The metal lines are comprised of high conductivity metals such as aluminum, copper, and tungsten.

Contact plugs, not shown, are typically provided between at least one of the source region 230, the drain region 232 and the gate electrode 226 and the metal line 236. For example, a tungsten plug can be formed by depositing tungsten and etching back or planarizing by a CMP process.

FIGS. 3a–3g illustrate cross-section views of a wafer during various steps of a second method embodiment of the present invention. The process begins in FIG. 3a, wherein a wafer 300 having a substrate 310 has been prepared by applying and patterning a mask 312 thereto. The substrate 310 may be, for example, silicon or glass, but preferably silicon. The mask 312 can be comprised of a common mask material such as silicon dioxide, silicon nitride, a silicon nitride on a silicon dioxide stack, or photoresist, but preferably comprises photoresist.

Figure 3A:
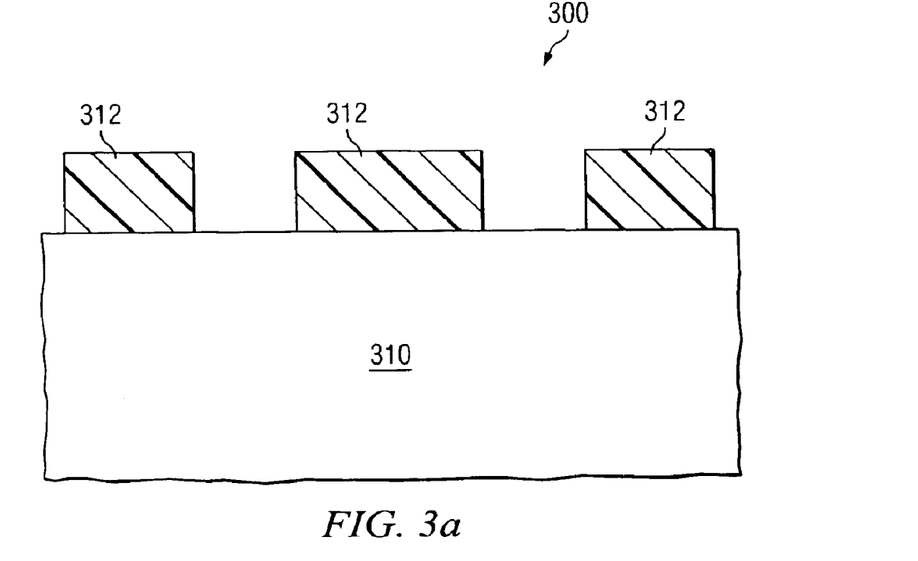
FIGS. 3a–3g are cross-section views of a wafer illustrating a process of forming isolation trenches in accordance with an embodiment of the present invention.
Figure 3B:
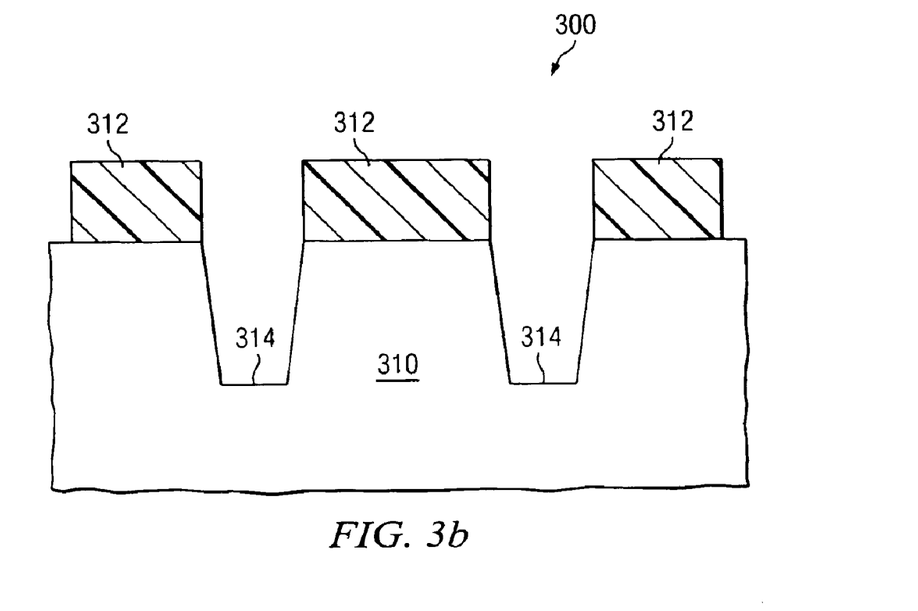

FIG. 3b is a cross-section view of wafer 300 illustrated in FIG. 3a after trenches 314 are etched in the silicon substrate, preferably using a plasma etching technique. Preferably, the depth of the trenches is about 2000 to 6000 Å.

Figure 3C:
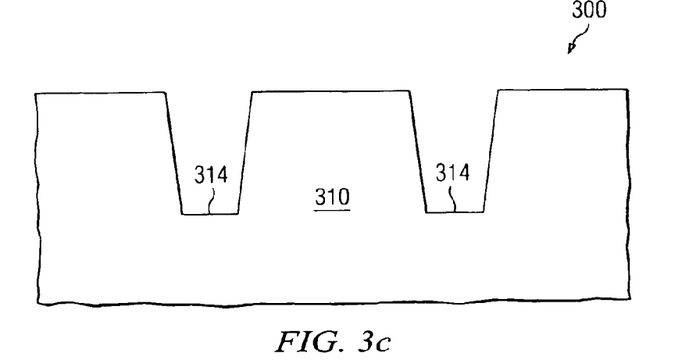

FIG. 3c is a cross-section view of wafer 300 illustrated in FIG. 3b after the mask 312 has been removed to expose the active regions. The mask 312 can be removed, for example, by an etch in hot phosphoric acid followed by an etch in dilute hydrofluoric acid.

Figure 3D:
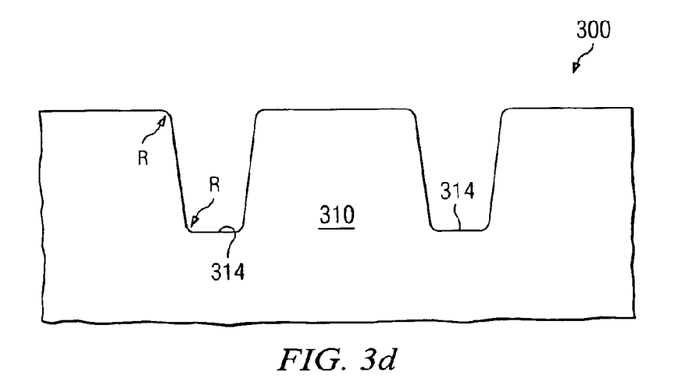

FIG. 3d is a cross-section view of wafer 300 illustrated in FIG. 3c after a corner-rounding process has been performed. Because a greater area of silicon is now exposed, silicon migration can be further facilitated. The corner-rounding process is described above with reference to FIG. 2e.

Figure 3E:
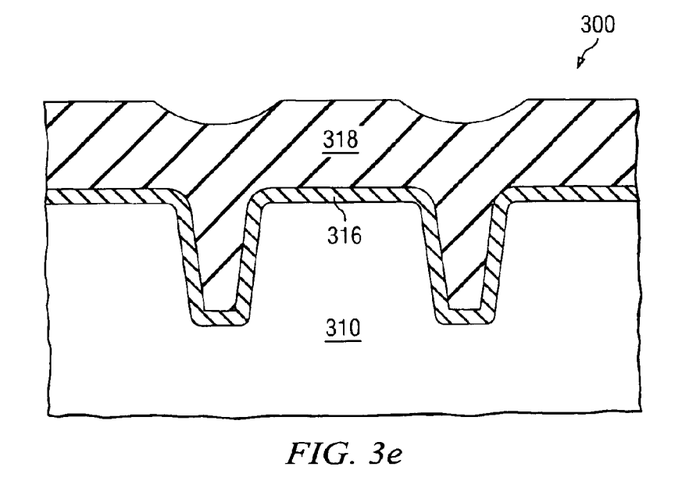

FIG. 3e is a cross-section view of wafer 300 illustrated in FIG. 3d after a nitrogen-containing liner 316 and a trench-filling method 318 is applied. The nitrogen-containing liner 316 can be a single silicon nitride layer or a silicon oxynitride $SiO_xN_y$ layer or a nitrogen-doped silicon oxide material, preferably where the atomic percentage of nitrogen in the nitrogen-containing liner is in the range of about 5 percent to about 60 percent. The nitrogen-containing liner 316 may be formed, for example, by CVD, thermal oxidation of silicon followed by nitridation, or by the nitridation. Nitridation is the process of introducing nitrogen atoms by exposing a surface to a nitrogen-containing ambient, such as a nitrogen-containing plasma.

Figure 3F:
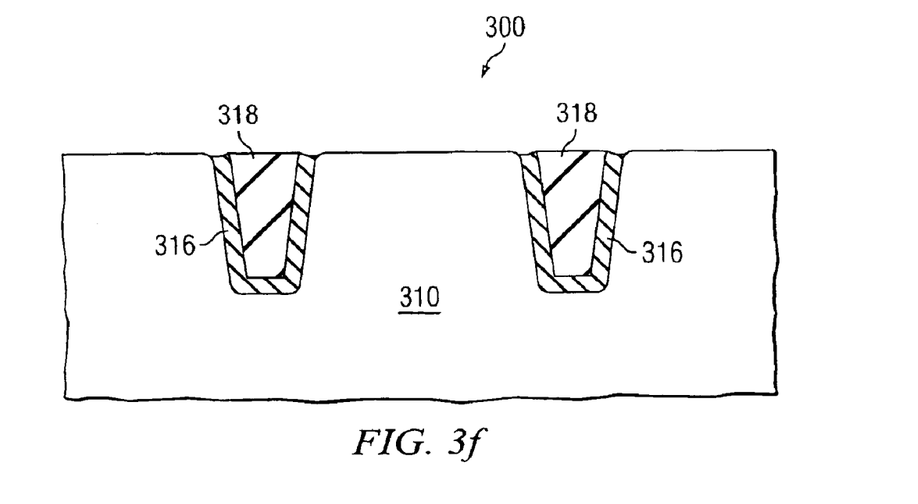

FIG. 3f is a cross-section view of wafer 300 illustrated in FIG. 3e after a highly selective planarization process, which stops on the portion of the nitrogen-containing liner overlying the active region. The highly selective planarization process can be a CMP process employing a slurry comprising of cerium oxide $CeO_2$, for example. The portion of the nitrogen-containing liner overlying the active region is then removed by an etch process. The etch process, for example, can be a wet etch in phosphoric acid or a plasma etching process.

Figure 3G:
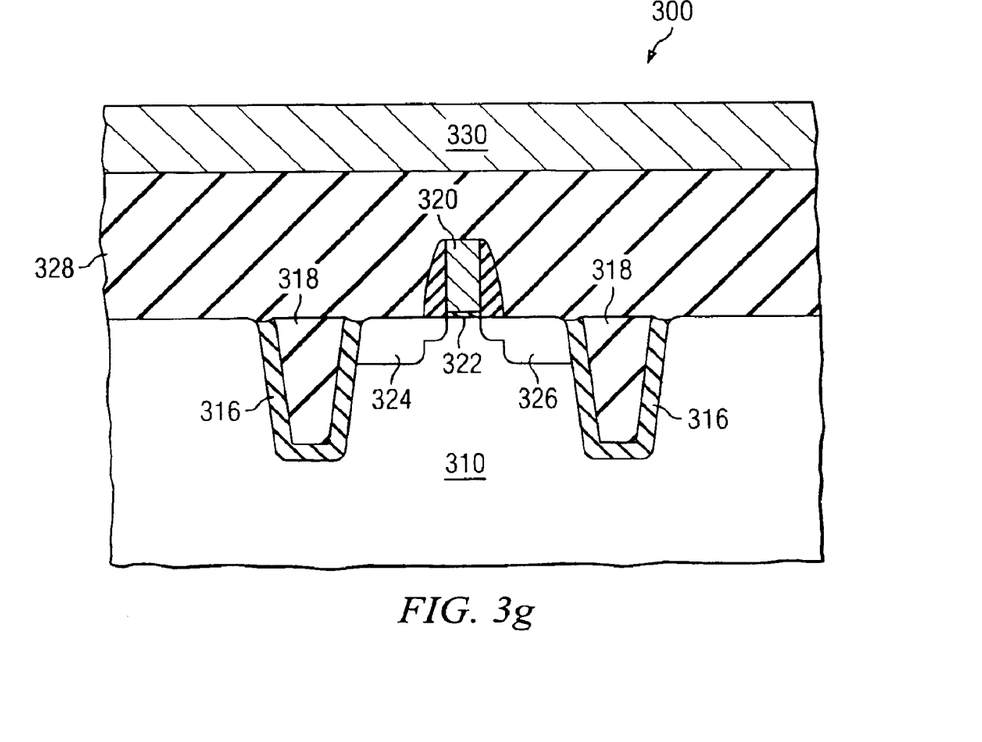

FIG. 3g is a cross-section view of wafer 300 illustrated in FIG. 3f after a transistor has been formed in the active regions. The transistor comprises a gate electrode 320, a gate dielectric 322, a source 324, and a drain 326. After the formation of the transistor, an inter-layer dielectric (ILD) 328 may be deposited over the transistors. The ILD layer 328 typically has a planarized surface and may be comprised of silicon oxide. The ILD layer 328 may be formed by deposition techniques such as CVD. Metal lines, such as metal line 330, may be formed on the planarized surface of the ILD layer 328. The metal lines are comprised of high conductivity metals such as aluminum, copper, and tungsten.

FIGS. 4a–4d illustrate cross-section views of a wafer during various steps of a third method embodiment of the present invention. The process begins in FIG. 4a, wherein a wafer 400 having a substrate 410 in which trenches 412 have been formed. One process that may be used to form the trenches 412 is described above with reference to FIGS. 3a–3c. The substrate 410 may be silicon or glass, but preferably silicon. Furthermore, the corners of the trenches 412 may or may not be rounded as described above in reference to FIG. 3d. If rounded corners are not present in the starting material, however, they are preferably rounded. If rounded corners are present in the starting material, they are preferably further rounded.

Figure 4A:
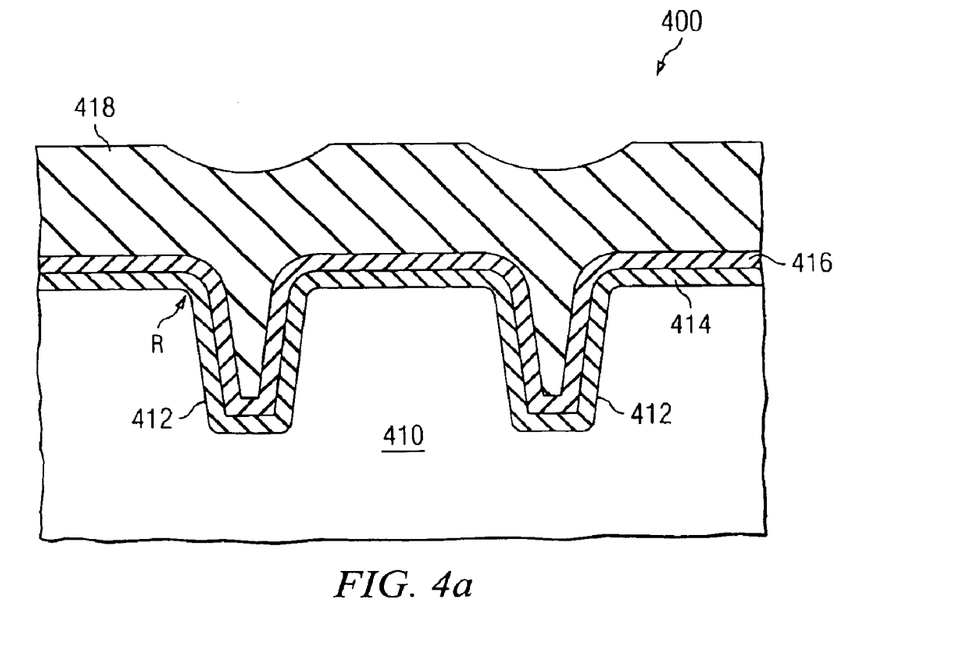
FIGS. 4a–4d are cross-section views of a wafer illustrating a process of forming isolation trenches in accordance with an embodiment of the present invention.

Referring now to FIG. 4a, a cross-section view is shown of wafer 400 after a silicon dioxide liner 414, a nitrogen-containing liner 416, and a trench-filling material 418 has been deposited on the substrate 410. The silicon dioxide liner 414 may be formed, for example, using wet or dry oxidation at a temperature in the range of 500° to 1000° C. The nitrogen-containing liner 416 is then formed thereon. The nitrogen-containing liner 416 may be formed, for example, by CVD or by nitridation. In the case where the nitridation process is performed, it introduces nitrogen into the silicon oxide liner layer. After the formation of the nitrogen-containing liner 416, a trench-filling material 418 is deposited.

Figure 4B:
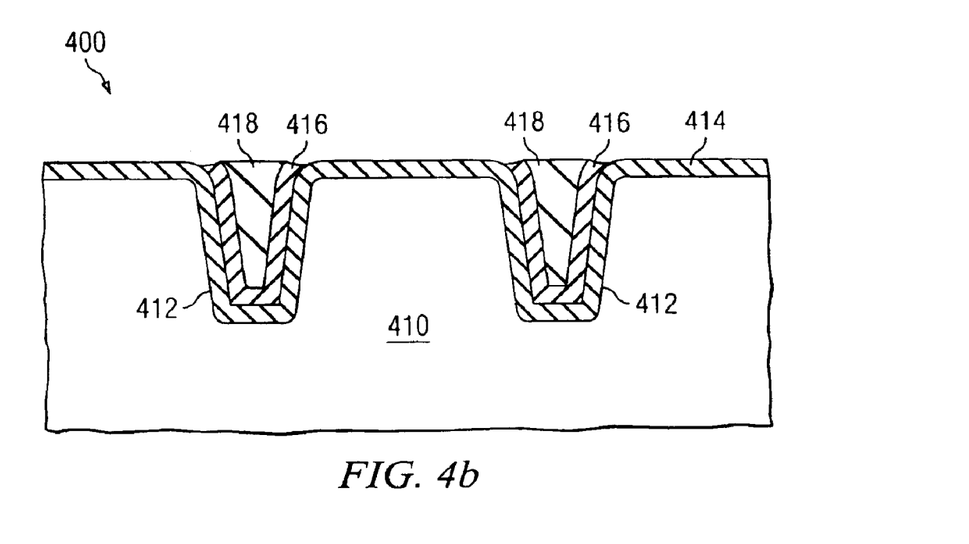

FIG. 4b is a cross-section view of wafer 400 illustrated in FIG. 4a after a highly selective planarization process has been performed to remove portions of the nitrogen-containing liner 416 and the trench-filling material 418. The highly selective planarization process stops on the portion of the nitrogen-containing liner 416 overlying the active region. The highly selective planarization process can be a CMP process employing a slurry comprising of cerium oxide ($CeO_2$), for example. The portion of the nitrogen-containing liner 416 overlying the active region is then removed by an etch process. The etch process, for example, can be a wet etch in phosphoric acid or a plasma etching process.

Figure 4C:
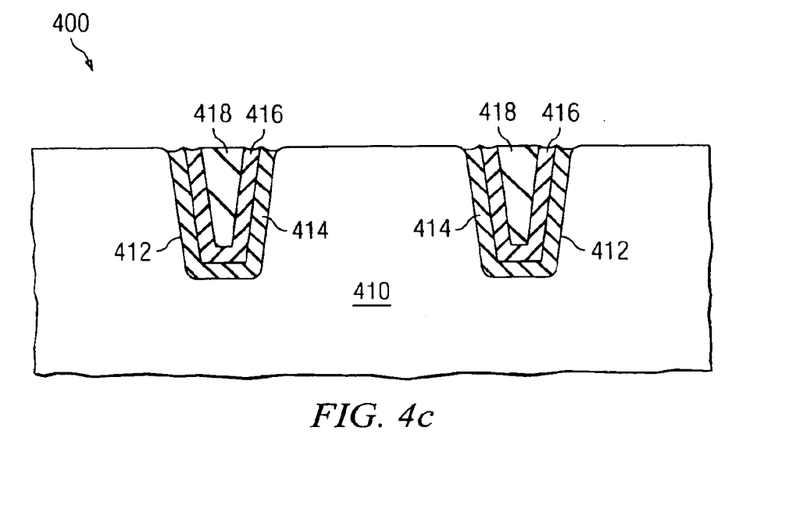

FIG. 4c is a cross-section view of wafer 400 illustrated in FIG. 4b after a portion of the silicon dioxide liner 414 has been removed. The silicon dioxide liner 414 covering the active region may be removed, for example, by a wet etch in dilute hydrofluoric acid.

Figure 4D:
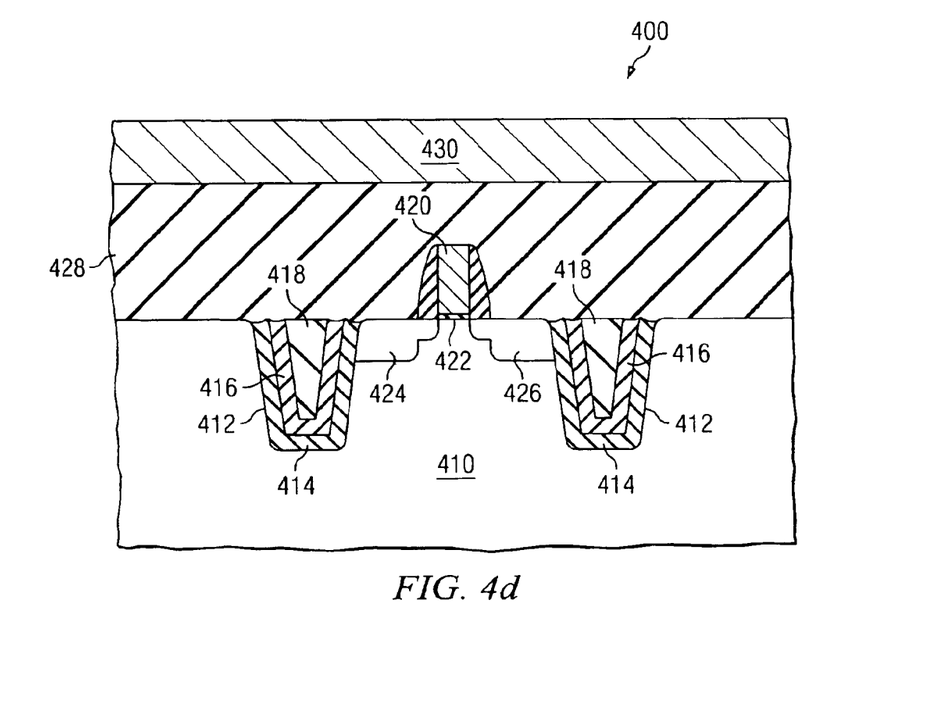

FIG. 4d is a cross-section view of wafer 400 illustrated in FIG. 4c after a transistor has been formed in the active regions. The transistor comprises a gate electrode 420, a gate dielectric 422, a source 424, and a drain 426. After the formation of the transistor, an inter-layer dielectric (ILD) 428 may be deposited over the transistors. The ILD layer 428 typically has a planarized surface and may be comprised of silicon oxide. The ILD layer 428 may be formed by deposition techniques such as CVD. Metal lines, such as metal line 430, may be formed on the planarized surface of the ILD layer 428. The metal lines are comprised of high conductivity metals such as aluminum, copper, and tungsten.

Although particular embodiments of the invention have been described in detail, it is understood that the invention is not limited correspondingly in scope, but includes all changes, modifications, and equivalents coming within the spirit and terms of the claims appended hereto. For example, while a shallow trench isolation is illustrated, it is understood that this invention may be extended to other isolation structures which are improvements of the shallow trench isolation structure. Accordingly, the specification and figures are to be regarded in an illustrative rather than a restrictive sense.

What is claimed is:

1. A method of forming an isolation structure, the method comprising:
   providing a substrate having a trench formed therein, the trench having at least one rounded corner;
   applying a first nitrogen-containing liner on a top surface of the substrate and the trench;
   forming a trench-filling material over the first nitrogen-containing liner, the trench-filling material substantially filling the trench; and
   removing a first portion of the first nitrogen-containing liner and the trench-filling material such that a second portion of the first nitrogen-containing liner and trench-filling material remains within the trench.

2. The method of claim 1, wherein the step of providing a substrate includes:
   applying a mask layer to the substrate;
   patterning the mask layer such that the patterned mask layer defines the trench;
   etching the mask layer and the substrate to form the trench in the substrate; and
   removing the mask layer.

3. The method of claim 2, wherein the mask layer comprises a silicon nitride mask layer.

4. The method of claim 2, further comprising rounding the corners of the trench after etching the substrate.

5. The method of claim 4, wherein the rounding the corners of the trench comprises rounding the corners by annealing the substrate in a gaseous ambient.

6. The method of claim 4, wherein the rounding the corners of the trench comprises rounding the corners by annealing the substrate in a gaseous ambient comprising hydrogen, nitrogen, helium, neon, argon, xenon, or a combination thereof.

7. The method of claim 4, wherein the rounding the corners of the trench comprises rounding the corners by annealing the substrate in a gaseous ambient, wherein the annealing is performed at a temperature of about 700 to about 950 degrees Celsius.

8. The method of claim 4, wherein the rounding the corners of the trench comprises rounding the corners by annealing the substrate in a gaseous ambient, wherein the annealing is performed at a pressure of about 1 Torr to about 1000 Torr.

9. The method of claim 4, wherein the rounding the corners of the trench comprises creating rounded corners having a radius of curvature of about 5 nm to about 50 nm.

10. The method of claim 1, wherein the first nitrogen-containing liner comprises $Si_3N_4$.

11. The method of claim 1, wherein the first nitrogen-containing liner comprises silicon oxynitride.

12. The method of claim 1, wherein the first nitrogen-containing liner has a nitrogen content about 5 of about 60 percent.

13. The method of claim 1, wherein the first nitrogen-containing liner has a thickness in the range of about 5 to about 200 angstroms.

14. The method of claim 1, wherein the trench-filling material is a dielectric.

15. The method of claim 14, wherein the trench-filling material comprises silicon oxide.

16. The method of claim 1, wherein the removing is performed at least in part by planarizing the trench-filling material.

17. The method of claim 16, wherein the planarizing step is a chemical mechanical polishing step.

18. The method of claim 1, further comprising forming transistors in close proximity to the trench.

19. The method of claim 1, further comprising:
   forming transistors on the substrate in close proximity to the trench;
   depositing an inter-layer dielectric over the transistors; and
   depositing a metal line on the inter-layer dielectric.

20. The method of claim 19, wherein the inter-layer dielectric comprises silicon oxide.

21. The method of claim 19, wherein the metal line comprises aluminum, copper, tungsten, or a combination thereof.

22. A method of forming an isolation structure, the method comprising:
   providing a substrate having a trench formed therein and a patterned mask thereon, the patterned mask overlies portions of the substrate adjacent to the trench;
   etching a portion of the patterned mask to pull-back the patterned mask from an edge of the trench;
   annealing the substrate in a gaseous ambient to form rounded corners on the trench;
   forming a nitrogen-containing liner over the trench and the patterned mask;
   filling the trench with a trench-filling material;
   exposing the nitrogen-containing liner over the patterned mask;
   removing a portion of the nitrogen-containing liner overlying the patterned mask; and
   removing the patterned mask.

23. The method of claim 22, further comprising forming transistors on the substrate in close proximity to the trench.

24. The method of claim 22, further comprising:
   forming transistors in a region of the substrate adjacent to the trench;
   forming an inter-layer dielectric over the transistors; and
   forming a metal line over the inter-layer dielectric.

25. The method of claim 24, wherein the inter-layer dielectric comprises silicon oxide.

26. The method of claim 24, wherein the metal line comprises aluminum, copper, tungsten, or a combination thereof.

27. The method of claim 22, wherein the patterned mask comprises a silicon nitride layer overlying a silicon dioxide layer.

28. The method of claim 22, wherein the rounded corners have a radius of curvature of about 5 to about 50 nm.

29. The method of claim 22, wherein the annealing step is performed at a temperature of about 700 to about 950 degrees Celsius.

30. The method of claim 22, wherein the gaseous ambient comprises hydrogen, nitrogen, helium, neon, argon, xenon, or a combination thereof.

31. The method of claim 22, wherein the annealing is performed at a pressure of about 1 to 1000 Torr.

32. The method of claim 22, wherein the nitrogen-containing liner comprises silicon nitride or silicon oxynitride.

33. The method of claim 22, wherein the nitrogen-containing liner has a nitrogen content of about 5 to 60 percent.

34. The method of claim 22, wherein the nitrogen-containing liner has a thickness of about 5 to 200 angstroms.

35. The method of claim 22, wherein the trench-filling material is a dielectric.

36. The method of claim 22, wherein the trench-filling material comprises silicon oxide.

37. The method of claim 22, further comprising planarizing to remove a portion of the trench-filling material.

38. The method of claim 22, further comprising planarizing to remove a portion of the trench-filling material, wherein the planarizing is performed by chemical mechanical polishing.

39. A method of forming an isolation structure, the method comprising:

providing a semiconductor substrate having a top surface and having a trench formed therein, the trench having rounded corners in a top portion and having rounded corners in a bottom portion;

forming nitrogen-containing liner over the trench and the top surface;

filling the trench with a trench-filling material;

planarizing the trench-filling material such that the nitrogen-containing liner remains; and removing the nitrogen-containing liner overlying the top surface.

40. The method of claim 39, further comprising forming transistors in a region of the semiconductor substrate adjacent to the trench.

41. The method of claim 40, further comprising:

forming an inter-layer dielectric over the transistors; and forming a metal line on the inter-layer dielectric.

42. The method of claim 41, wherein the inter-layer dielectric comprises silicon oxide.

43. The method of claim 41, wherein the metal line comprises aluminum, copper, tungsten, or a combination thereof.

44. The method of claim 39, wherein the rounded corners have a radius of curvature in the range of about 5 to about 50 nm.

45. The method of claim 39, wherein the providing the semiconductor substrate includes:

forming a patterned mask over the semiconductor substrate;

forming a trench in a portion of the semiconductor substrate not covered by the patterned mask;

removing the patterned mask; and annealing the semiconductor substrate in a gaseous ambient to form the rounded corners.

46. The method of claim 45, wherein the annealing the semiconductor substrate is performed at a temperature in the range of about 700 to about 950 degrees Celsius.

47. The method of claim 45, wherein the gaseous ambient comprises hydrogen, nitrogen, helium, neon, argon, xenon, or a combination thereof.

48. The method of claim 45, wherein the annealing the semiconductor substrate is performed at a pressure in the range of about 1 Torr to about 1000 Torr.

49. The method of claim 39, further comprising forming a silicon dioxide liner prior to forming the nitrogen-containing liner.

50. The method of claim 39, wherein the nitrogen-containing liner comprises silicon nitride or silicon oxynitride.

51. The method of claim 39, wherein the nitrogen-containing liner has a nitrogen content of about 5 to about 60 percent.

52. The method of claim 39, wherein the nitrogen-containing liner has a thickness in the range of about 5 to about 200 angstroms.

53. The method of claim 39, wherein the trench-filling material is a dielectric.

54. The method of claim 53, wherein the trench-filling material comprises silicon oxide.

55. The method of claim 39, wherein the planarizing the trench-filling material is performed by a chemical mechanical polishing process.

56. The method of claim 55, wherein the chemical mechanical polishing process employs a slurry comprising of cerium oxide.

* * * * *

UNITED STATES PATENT AND TRADEMARK OFFICE
CERTIFICATE OF CORRECTION

PATENT NO. : 6,974,755 B2
DATED : December 13, 2005
INVENTOR(S) : Ko et al.

It is certified that error appears in the above-identified patent and that said Letters Patent is hereby corrected as shown below:

<u>Column 8,</u>
Line 12, delete "content about" insert -- content of about --; and delete "5 of about" insert -- 5 to about --.

<u>Column 9,</u>
Line 38, delete "forming nitrogen-containing" insert -- forming a nitrogen-containing --.

<u>Column 10,</u>
Line 48, delete "of cerium" insert -- cerium --.

Signed and Sealed this

Fourth Day of April, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,974,755 B2 | Page 1 of 1 |
| APPLICATION NO. | : 10/687377 | |
| DATED | : December 13, 2005 | |
| INVENTOR(S) | : Ko et al. | |

It is certified that error appears in the above-identified patent and that said Letters Patent is hereby corrected as shown below:

In the Inventor Field (75) on the cover sheet, line 3, delete "Chung-Hu Ge" and insert --Chung-Hu Ke--

Signed and Sealed this

Thirtieth Day of October, 2007

JON W. DUDAS
*Director of the United States Patent and Trademark Office*